United States Patent
Yu et al.

(10) Patent No.: US 8,143,162 B2
(45) Date of Patent: Mar. 27, 2012

(54) INTERCONNECT STRUCTURE HAVING A SILICIDE/GERMANIDE CAP LAYER

(75) Inventors: Chen-Hua Yu, Hsin-Chu (TW); Yung-Cheng Lu, Taipei (TW); Hui-Lin Chang, Hsin-Chu (TW); Ting-Yu Shen, JiJi Town (TW); Hung Chun Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/500,796

(22) Filed: Jul. 10, 2009

(65) Prior Publication Data

US 2009/0275195 A1 Nov. 5, 2009

Related U.S. Application Data

(63) Continuation of application No. 11/523,940, filed on Sep. 20, 2006, now abandoned.

(60) Provisional application No. 60/789,028, filed on Apr. 4, 2006.

(51) Int. Cl.
*H01L 21/44* (2006.01)
*H01L 27/04* (2006.01)

(52) U.S. Cl. ........ 438/687; 438/627; 438/634; 438/682; 257/682; 257/687; 257/751; 257/758; 257/762; 257/E21.576; 257/E21.579; 257/E23.144; 257/E23.145; 257/E27.016; 174/262

(58) Field of Classification Search .......... 438/627, 438/634, 682, 687; 257/682, 687, 751, 758, 257/762, E21.576, E21.579, E23.144, E23.145, 257/E27.016; 174/262
See application file for complete search history.

(56) References Cited

U.S. PATENT DOCUMENTS

| | | | | |
|---|---|---|---|---|
| 5,420,069 A * | 5/1995 | Joshi et al. | | 438/652 |
| 5,830,775 A * | 11/1998 | Maa et al. | | 438/141 |
| 6,181,013 B1 * | 1/2001 | Liu et al. | | 257/762 |
| 6,515,367 B1 | 2/2003 | Bernard et al. | | |
| 6,518,184 B1 * | 2/2003 | Chambers et al. | | 438/687 |
| 6,884,715 B1 | 4/2005 | Kwon et al. | | |
| 6,977,218 B2 | 12/2005 | Yu et al. | | |
| 7,256,498 B2 * | 8/2007 | Huang et al. | | 257/758 |
| 7,576,006 B1 * | 8/2009 | Yu et al. | | 438/687 |
| 2005/0014360 A1 * | 1/2005 | Yu et al. | | 438/622 |
| 2005/0194683 A1 * | 9/2005 | Yu et al. | | 257/738 |
| 2006/0263979 A1 * | 11/2006 | Nejad et al. | | 438/256 |
| 2007/0052101 A1 | 3/2007 | Usami | | |
| 2007/0111522 A1 * | 5/2007 | Lim et al. | | 438/682 |

FOREIGN PATENT DOCUMENTS

CN 1630060 6/2005

OTHER PUBLICATIONS

Hymes, S., et al., "Passivation of copper by silicide formation in dilute silane," J. Appl. Phys. vol. 71, No. 9, American Institute of Physics, May 1, 1992, pp. 4623-4625.

Baba, A., et al., "Growth kinetics of CoSi formed by ion beam irradiation at room temperature," J. Appl. Phys. vol. 82, No. 11, American Institute of Physics, Dec. 1, 1997, pp. 5480-5483.

* cited by examiner

*Primary Examiner* — Dao H Nguyen
(74) *Attorney, Agent, or Firm* — Slater & Matsil, L.L.P.

(57) ABSTRACT

An interconnect structure of an integrated circuit and a method for forming the same are provided. The interconnect structure includes a semiconductor substrate, a low-k dielectric layer over the semiconductor substrate, a conductor in the low-k dielectric layer, and a cap layer on the conductor. The cap layer has at least a top portion comprising a metal silicide/germanide.

20 Claims, 9 Drawing Sheets

INTERCONNECT STRUCTURE HAVING A SILICIDE/GERMANIDE CAP LAYER

This application is a continuation of U.S. patent application Ser. No. 11/523,940, entitled "Interconnect Structure Having a Silicide/Germanide Cap Layer," filed Sep. 20, 2006 now abandoned, which claims the benefit of U.S. Provisional Application No. 60/789,028, filed on Apr. 4, 2006, entitled "Interconnect Structure Having a Silicide/Germanide Cap Layer," all of which applications are hereby incorporated herein by reference.

TECHNICAL FIELD

This invention is related generally to integrated circuits, and more particularly to the structure and methods of interconnect structures in integrated circuits.

BACKGROUND

A conventional integrated circuit contains a plurality of patterns of metal lines separated by inter-wiring spacings and a plurality of interconnect lines, such as bus lines, bit lines, word lines and logic interconnect lines. Typically, the metal patterns of vertically spaced metallization layers are electrically interconnected by vias. Metal lines formed in trench-like openings typically extend substantially parallel to the semiconductor substrate. Semiconductor devices of such type, according to current technology, may comprise eight or more levels of metallization to satisfy device geometry and micro-miniaturization requirements.

A common method for forming metal lines or plugs is known as "damascene." Generally, this process involves forming an opening in the dielectric interlayer, which separates the vertically spaced metallization layers. The opening is typically formed using conventional lithographic and etching techniques. After an opening is formed, the opening is filled with copper or copper alloys to form a via. Excess metal material on the surface of the dielectric interlayer is then removed by chemical mechanical planarization (CMP).

Copper has replaced aluminum because of its lower resistivity. However, copper still suffers from electro migration (EM) and stress migration (SM) reliability issues as geometries continue to shrink and current densities increase.

FIG. 1 illustrates a cross-sectional view of a conventional interconnection structure 1 formed using damascene processes. Metal lines 2 and 4, which are typically formed of copper or copper alloys, are interconnected by via 10. Inter-metal-dielectric (IMD) 8 separates the two layers where metal lines 2 and 4 are located. Etch stop layer (ESL) 5 is formed on lower layer copper line 2. Diffusion barrier layers 12 and 14 are formed to prevent copper from diffusing into surrounding materials. The interconnection structure 1 illustrated in FIG. 1 suffers from electro-migration and stress-migration problems. Since the copper line 2 is in direct contact with a dielectric ESL 5, the character difference between copper 2 and dielectric ESL 5 causes higher electro-migration and stress migration, and thus device reliability is degraded. In addition, ESL 5 typically has a higher dielectric constant (k value) than low-k dielectric layers 6 and 8. As a result, the parasitic capacitances between the metal lines are increased.

FIG. 2 illustrates an improved interconnection structure 3. A metal cap layer 16 is formed on copper line 2. Cap layer 16 is typically formed of materials suffering less from electro migration and stress migration. This layer improves the reliability of the interconnect structure by reducing copper surface migration. It has been found that under stressed conditions, the mean time to failure (MTTF) of the interconnect structure 3 is ten times longer than that of the interconnection structure 1. With the cap layer 16, the stress-induced void formation is also significantly reduced. Additionally, the parasitic capacitances are also reduced.

However, the introduction of cap layer 16 generates another problem. Cap layer 16 may be degraded by oxygen or chemical contamination. This not only introduces voids into cap layer 16 and increases the surface roughness, but it also increases the resistance of the via structure. A more severe problem is that the probability of via failure increases. Therefore, in order to improve the quality of the interconnect structures, a new interconnect structure and a method for forming the same are needed.

SUMMARY OF THE INVENTION

In accordance with one aspect of the present invention, an integrated circuit interconnect structure includes a semiconductor substrate, a low-k dielectric layer over the semiconductor substrate, a conductor in the low-k dielectric layer, and a cap layer on the conductor, wherein the cap layer has at least a top portion comprising a metal silicide/germanide.

In accordance with another aspect of the present invention, a damascene structure includes a first low-k dielectric layer, an opening in the first low-k dielectric layer, wherein the opening extends from a top surface to a bottom surface of the first low-k dielectric layer, a first copper feature filled in the opening, and a metallic cap layer on the first copper feature, wherein the metallic cap layer comprises silicide/germanide.

In accordance with another aspect of the present invention, a semiconductor structure includes a semiconductor substrate, a low-k dielectric layer over the semiconductor substrate, a conductor in the low-k dielectric layer, a cap layer on the conductor, wherein the cap layer has at least a top portion comprising a metal silicide/germanide, and an etch stop layer over the low-k dielectric layer.

In accordance with yet another aspect of the present invention, a method for forming an interconnect structure includes providing a low-k dielectric layer, forming an opening in the low-k dielectric layer, forming a conductor extending from a top surface of the low-k dielectric layer into the low-k dielectric layer, and forming a cap layer over the conductor layer, wherein the cap layer comprises silicide/germanide in at least a top portion.

In accordance with yet another aspect of the present invention, a method for forming an interconnect structure includes providing a low-k dielectric layer, forming an opening in the low-k dielectric layer, forming a copper feature extending from a top surface of the low-k dielectric layer into the low-k dielectric layer, forming a conductive cap layer on the copper feature, and performing a silicidation/germanidation to at least a top portion of the conductive cap layer to form a silicide/germanide layer.

In accordance with yet another aspect of the present invention, a method for forming an interconnect structure includes providing a low-k dielectric layer comprising silicon, forming an opening in the low-k dielectric layer, forming a copper feature extending from a top surface of a the low-k dielectric layer into the low-k dielectric layer, forming a conductive cap layer on the copper feature, performing a silicidation to at least a top portion of the conductive cap layer to form a silicide layer, and performing a plasma treatment to the silicide layer and the low-k dielectric layer to form an etch stop layer.

With the silicide/germanide layers formed on top of the copper lines, the overall resistance and reliability of the interconnect structure are improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel interconnect structure for integrated circuits and a method of forming the same are provided. The intermediate stages of manufacturing a preferred embodiment of the present invention are illustrated. The variations of the preferred embodiments are discussed. Throughout the various views and illustrative embodiments of the present invention, like reference numbers are used to designate like elements.

Figure 1:
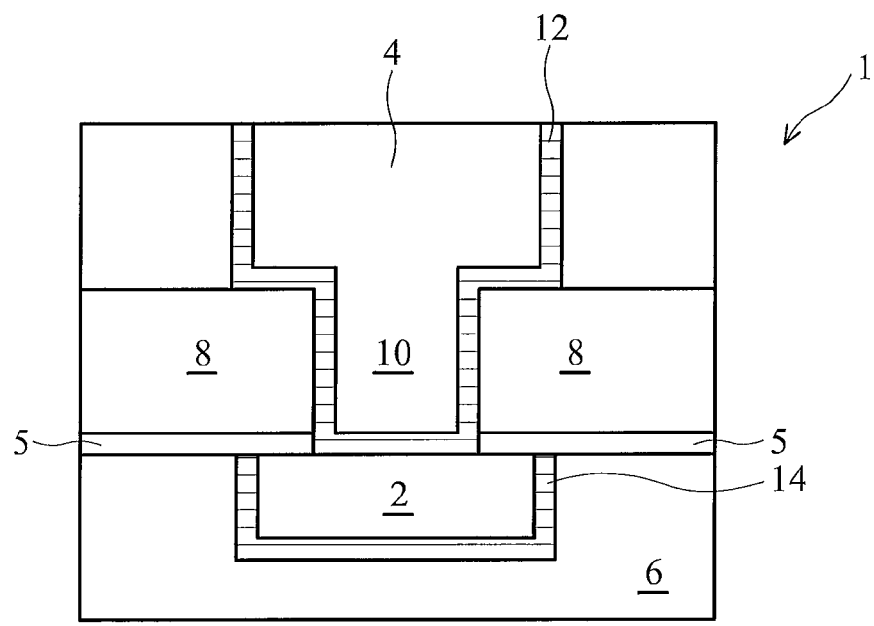
FIG. 1 illustrates a conventional interconnect structure comprising a copper line and an etch stop layer.
Figure 2:
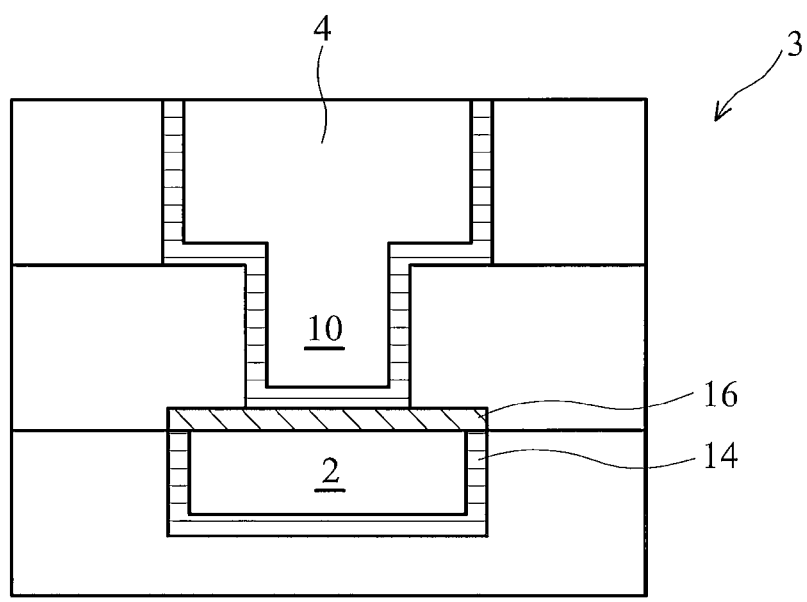
FIG. 2 illustrates a conventional interconnect structure comprising a copper line and a metal cap layer on the copper line.
Figure 3:
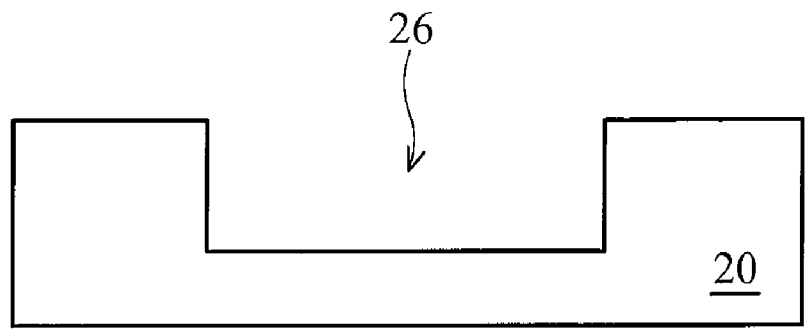
FIGS. 3 through 8B are cross-sectional views of intermediate stages in the manufacture of an interconnect structure.

FIGS. 3 through 8 are cross-sectional views of intermediate stages in the making of a preferred embodiment of the present invention. FIG. 3 illustrates the formation of a trench 26 in a low-k dielectric layer 20. In the preferred embodiment, dielectric layer 20 is an inter-metal dielectric (IMD) having a low dielectric constant value (k value), preferably lower than about 3.5. Low-k dielectric layer 20 may comprise commonly used low-k dielectric materials, such as carbon-containing dielectric materials and may further contain nitrogen, hydrogen, oxygen, and combinations thereof.

Figure 4:
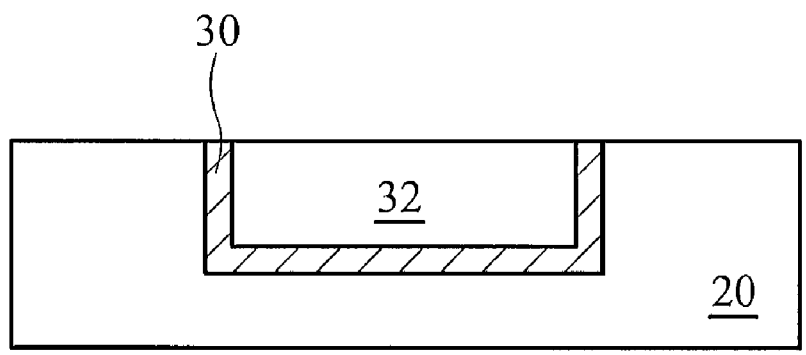

FIG. 4 illustrates a diffusion barrier layer 30 and a conductive line 32 formed in trench 26. Barrier layer 30 preferably includes titanium, titanium nitride, tantalum, tantalum nitride, or other alternatives. The material of conductive line 32 is preferably copper or a copper alloy. Throughout the description, conductive line 32 is alternatively referred to as copper line 32, although it may comprise other conductive materials, such as silver, gold, tungsten, aluminum, and the like. As is known in the art, steps for forming copper line 32 include depositing a thin seed layer of copper or copper alloy and filling the trench 26, preferably by plating. A chemical mechanical planarization (CMP) is then performed to level the surface of copper line 32.

Figure 5:
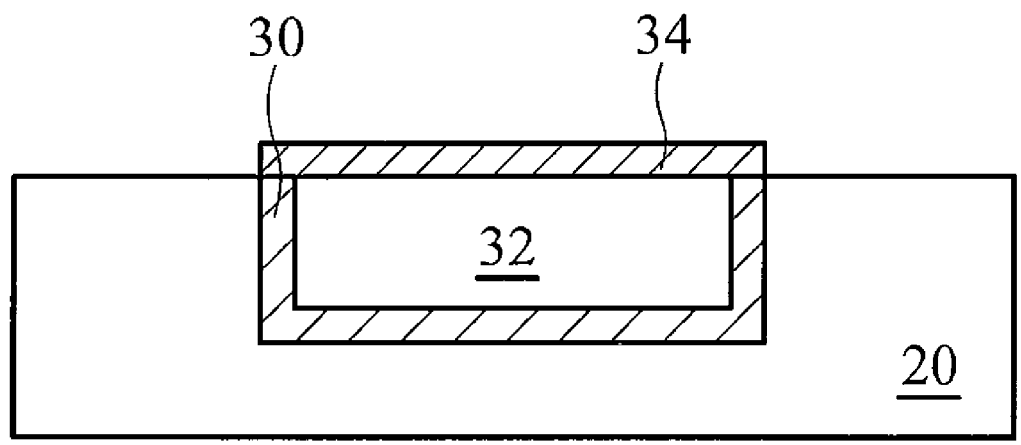

FIG. 5 illustrates a metal cap 34 formed on conductive line 32. Metal cap 34 preferably comprises materials such as copper, cobalt, nickel, tungsten, molybdenum, tantalum, boron, iron, phosphorus, and combinations thereof. These materials may exist in the form of CoP, CoB, CoWP, CoWB, NiWP, CoSnP, NiWB, NiMoP, and combinations thereof. Metal cap 34 has a preferred thickness of about 25 Å to about 200 Å, although it may have a greater or smaller thickness. Metal cap 34 may be a single layer or a composite layer comprising more than one sub layer. Similarly, each of the sub layers may comprise cobalt, nickel, tungsten, molybdenum, tantalum, boron, iron, and phosphorus. These materials may exist in each sub layer in the form of CoP, CoB, CoWP, CoWB, NiWP, CoSnP, NiWB, NiMoP, and combinations thereof. Other materials are within the contemplated scope of the invention, as well.

In the preferred embodiment, metal cap 34 is selectively formed by electroless plating. As copper line 32 is conductive and dielectric layer 20 is not conductive, metal cap 34 may be formed only on copper line 32 and perhaps top edges of barrier layer 30 also. No metal cap is formed on the top surface of dielectric layer 20. In other embodiments, metal cap 34 is blanket deposited using commonly used techniques such as sputtering, physical vapor deposition (PVD), and the like. The portion of the metal layer 34 located on the top surface of the dielectric layer 20 is then etched.

An optional pretreatment is then performed on the surface of metal cap 34. In the preferred embodiment, the pretreatment includes a hydrogen-based gas bath in a production tool such as one used for plasma enhanced chemical vapor deposition (PECVD). The hydrogen-based gases preferably include $H_2$, $NH_3$, and the like. In alternative embodiments, the pretreatment is performed in a nitrogen-based gas environment, which contains nitrogen-containing gases, for example, $N_2$, $NH_3$, and the like. Similarly, the nitrogen-based pretreatment may be performed using a production tool used for PECVD. The pretreatment has the function of removing oxygen and possibly some chemical contamination from metal cap 34. Additionally, the surface of metal cap 34 is activated, partially due to the removal of oxygen from metal cap 34, making the subsequent silicide process easier. In addition, the surface roughness of the metal cap 34 is reduced by the pretreatment, and the subsequent formation of either a silicide layer, a dielectric layer, and/or a low-k dielectric layer is improved, which in turn reduces the likelihood of delamination between layers. Preferably, the pretreatment lasts for about 3 seconds to about 20 seconds.

Figure 6A:
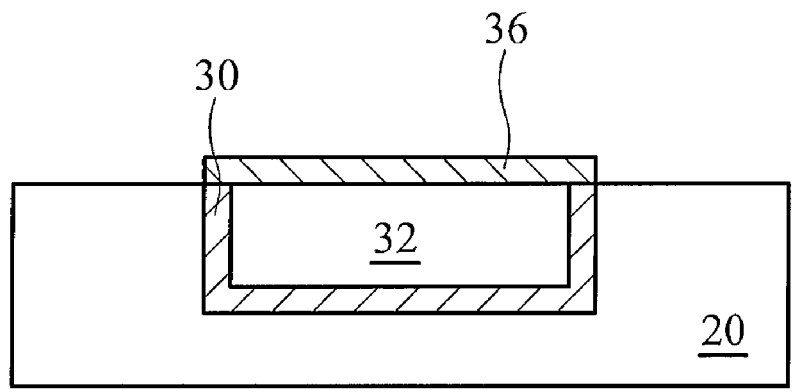

Referring to FIG. 6A, a silicidation/germanidation process is performed on metal cap 34 and converts the metal cap 34 into a silicide/germanide cap 36, wherein the silicide/germanide may comprise silicide only, germanide only, or germano-silicide. Likewise, the silicidation/germanidation process includes either silicidation, germanidation, or germano-silicidation. For this reason, as used herein, "silicidation/germanidation" means either silicidation or germanidation, of alternatively both silicidation and germanidation. Likewise, "silicide(d)/germanide(d)" refers to either silicide(d) or germanide(d) or both. "Silicon/germanium" refers to with silicon, or germanium, or silicon and germanium. In the preferred embodiment, the silicidation/germanidation process involves the soaking of metal cap 34 in silicon-based gases and/or germanium-based gases. As a result, silicon and/or germanium are incorporated into metal cap 34 and form silicide/germanide. The applicable gases include silicon and/or germanium containing gases, for example, $SiH_4$, $Si_2H_6$, SiH, $GeH_4$, $Ge_2H_6$, GeH, and combinations thereof. Preferably, the silicidation/germanidation process is performed at an elevated temperature, for example, between about 275° C. and about 425° C. The process duration is preferably between about 5 seconds and about 60 seconds, and the gas pressure is preferably between about 10 mtorr to about 760 torr, which is one atmosphere. In alternative embodiments, a plasma-assisted silicidation/germanidation is performed, preferably in a production tool used for PECVD, wherein essentially the same process gases may be introduced. Alternatively, silicidation/germanidation may be performed by forming a silicon/germanium layer, either by deposition or by using the previously discussed process gases, and then performing an ultraviolet (UV) treatment or ion beam irradiation. The resulting cap 36 has a preferred thickness of between about 50 Å and about 200 Å.

Figure 6B:
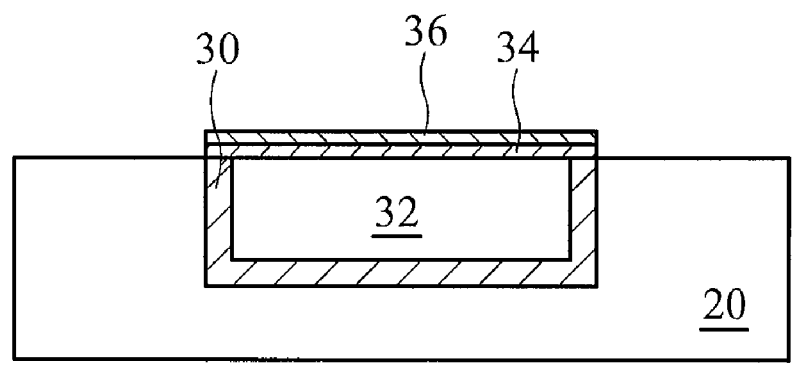

FIG. 6A illustrates a fully silicided/germanided metal cap 36. In a more preferred embodiment, a partially silicided/germanided metal cap, which includes a top silicide/germanide portion 36 and a bottom portion 34 as illustrated in FIG. 6B, is formed. As is known in the art, whether the metal cap 34 is fully or partially silicided/germanided may be controlled by adjusting silicidation/germanidation factors such as time, gas flow rate, temperature, etc. One skilled in the art will find optimum process conditions through routine experiments.

The underlying copper line 32, however, is preferably not silicided/germanided. A thin native copper oxide layer (not shown) may exist on the surface of copper line 32. The bonds formed between oxygen atoms and copper atoms tend to prevent the bonding between silicon/germanium atoms and copper atoms. As the native copper oxide layer is typically thin, for example, with a thickness of less than about 20 Å, there is no significant adverse effects to the resistivity of the resulting interconnect structure.

In alternative embodiments, the silicide/germanide cap 36 may be directly deposited on copper line 32. In an exemplary embodiment, a silicide/germanide layer is blanket formed and portions of the silicide/germanide layer that are located on dielectric layer 20 are then removed. In other embodiments, silicide/germanide cap 36 may be selectively deposited, for example, by electroless plating, on copper line 32 only.

Figure 6C:
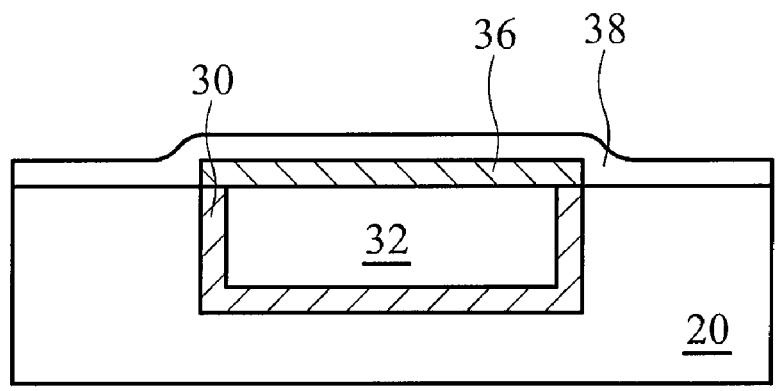

An optional dielectric layer 38 may be formed on the previously formed structure, as is shown in FIG. 6C. This dielectric layer 38 may be an etch stop layer (ESL), a cap layer, or any other applicable layer. Throughout the description, dielectric layer 38 is equally referred to as ESL 38. ESL 38 preferably has a dielectric constant of greater than about 3.5, and may comprise materials such as SiN, SiC, SiCN, SiCO, carbon-based materials, $CH_x$, $CO_yH_x$, and combinations thereof. In the preferred embodiment, low-k dielectric layer 20 and silicide/germanide cap 36 both comprise silicon, and dielectric layer 38 is formed by performing a plasma treatment to the surfaces of low-k dielectric layer 20 and silicide/germanide cap 36. An advantageous feature of the preferred embodiment is that both low-k dielectric layer 20 and silicide/germanide cap 36 comprise silicon, and thus by adding desired elements such as carbon, nitrogen, oxygen, and combinations thereof, ESL 38 may be formed. This approach is different from conventional ESL formation methods, which typically involves chemical vapor deposition methods using precursors.

Preferably, ESL 38 is formed in-situ in the same environment for performing the silicidation/germanidation process, wherein plasma is provided. The reaction gases depend on the desired composition of the resulting ESL 38. For example, if SiN is to be formed, process gases such as $NH_3$, $SiH_4$ may be used. If SiCO is to be formed, process gases preferably include $CO_2$, $Si(CH_3)_4$, $Si(CH_3)_3H$, and the like. If SiCN is to be formed, process gases preferably include $CO_2$, $NH_3$, $Si(CH_3)_4$, $Si(CH_3)_3H$, and the like. If SiC is to be formed, process gases preferably include $Si(CH_3)_4$, $Si(CH_3)_3H$, $CO_2$, and the like. Alternatively, ESL 38 is formed in a different environment from the preceding process steps.

Figure 6D:
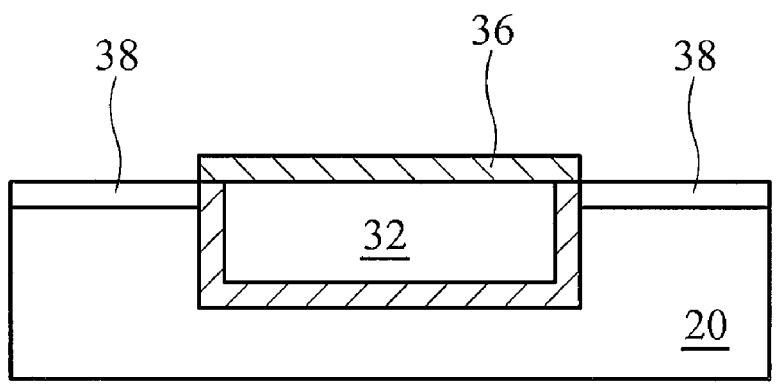

ESL 38 may also be formed using plasma treatment. When dielectric layer 20 is treated with plasma, a surface portion of dielectric layer 20 is converted to an ESL 38, as is illustrated in FIG. 6D. Preferably, the plasma treatment is performed in a chamber having process gases such as oxygen, hydrogen, nitrogen, ammonia, and combinations thereof. ESL 38 formed using plasma treatment is a self-aligned layer having high coherence/conformity with the underlying dielectric layer 20. Another advantageous feature is that ESL 38 has an improved interface adhesion with dielectric layer 20. In addition, the effective k value of ESL 38 can be lower than a deposited ESL layer.

In an exemplary embodiment, SiCN is formed, and the process conditions include process gases of $Si(CH_3)_4$, $Si(CH_3)_3H$, or $NH_3$, a chamber pressure of between about 1 mtorr and about 10 torr, a substrate temperature of between about 250° C. and about 450° C., and a process duration of about 5 seconds and about 300 seconds. The resulting ESL 38 has a thickness of from about 25 Å to about 550 Å.

As a side effect of the silicidation/germanidation process, silicon and/or germanium may be deposited on the surface of the dielectric layer 20. Furthermore, there may be un-bonded silicon/germanium on and/or in silicide/germanide layer 36. This leftover silicon and/or germanium is preferably removed if ESL 38 is not to be formed. The removal of the leftover silicon and/or germanium may be performed by thermal heating, plasma, CVD treatment or ultra-violet treatment. In an exemplary embodiment, a thermal removal is performed at a temperature of about 400° C. for a duration of between about 5 seconds and about 30 minutes, and at a pressure of about 3 torr to about 10 torr. The thermal removal is preferably in a chamber containing gases such as Ar, $N_2$, $N_2/H_2$, and combinations thereof. Alternatively, plasma, CVD heating, and/or UV treatment can be used to remove the excess silicon/germanium. Conversely, if ESL 38 is to be formed, this removal step is not necessary.

In a variation of the preferred embodiment, the order of the previously discussed process steps may be changed. For example, dielectric layer 38 may be formed on the dielectric layer 20 after the formation of copper layer 32 and metal cap 34. The pretreatment and silicidation/germanidation process may then be performed after the formation of dielectric layer 38.

Figure 7:
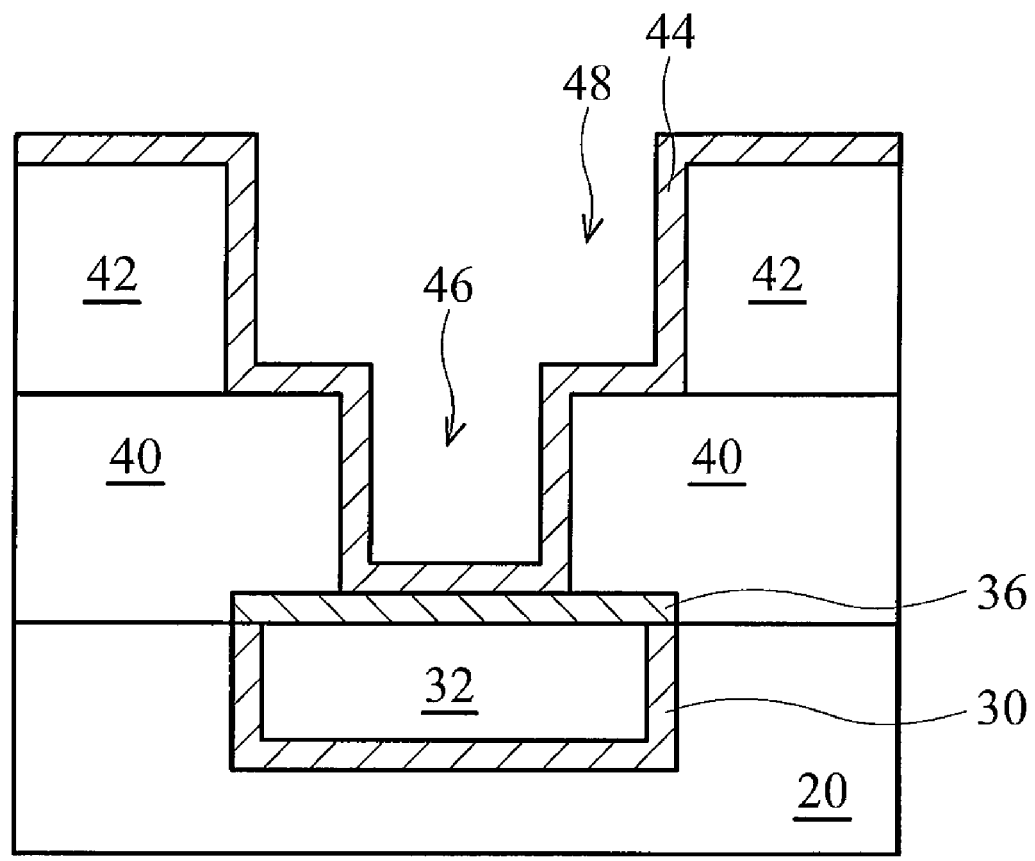

After silicide/germanide cap 36 is formed, more damascene processes may be performed to form more overlying structures, for example, a via and an overlying copper line. As is known in the art, the via and its overlying copper line can be formed by either a single damascene process or a dual damascene process. FIG. 7 illustrates a structure formed using a dual damascene process. A via IMD layer 40 is formed over dielectric layer 20. Via IMD layer 40 is preferably a low-k dielectric layer having a k value less than about 3.5 or an ultra low-k dielectric layer having a k value of less than about 2.7, and may comprise carbon-doped silicon oxide, fluorine-doped silicon oxide, organic low-k material and porous low-k material. The preferred formation method includes spin-on, chemical vapor deposition (CVD) or other known methods. A trench IMD 42 is then formed over via IMD layer 40. The trench IMD 42 is preferably formed using similar methods and similar materials as via IMD layer 40. Optionally, an etch stop layer (not shown) may be formed on IMD layer 40 prior to forming IMD 42. Trench IMD 42 and via IMD 40 may by formed of porous materials. Preferably, via IMD 40 has a k value greater than the k value of trench IMD 42. A via opening 46 and a trench opening 48 are then formed. The methods for forming via opening 46 and trench opening 48 are well known in the art, thus are not repeated herein.

Figure 8A:
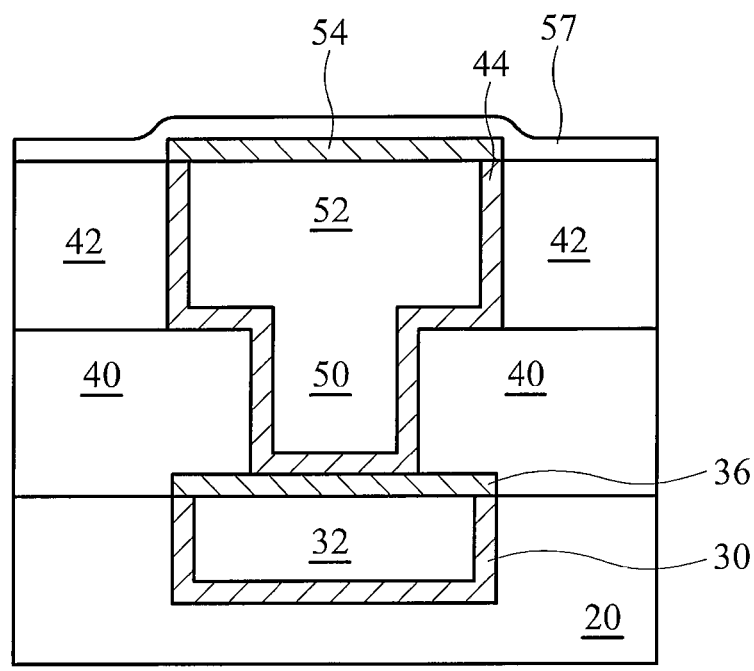

Referring to FIG. 8A, a diffusion barrier layer 44 is formed. The remaining via opening 46 and trench opening 48 are then filled with conductive materials, preferably copper or copper alloys. A chemical mechanical polish is then performed to remove excess materials. The remaining portion of the conductive material forms a conductive line 52 and a via 50.

FIG. 8A further illustrates a cap layer 54 formed on conductive line 52. Cap layer 54 preferably includes at least a top silicide/germanide portion. An ESL 57 may also optionally be formed over trench IMD 42 and cap layer 54. The materials and formation methods of cap layer 54 are essentially the same as those for silicide/germanide cap 36, and thus are not repeated herein.

Figure 8B:
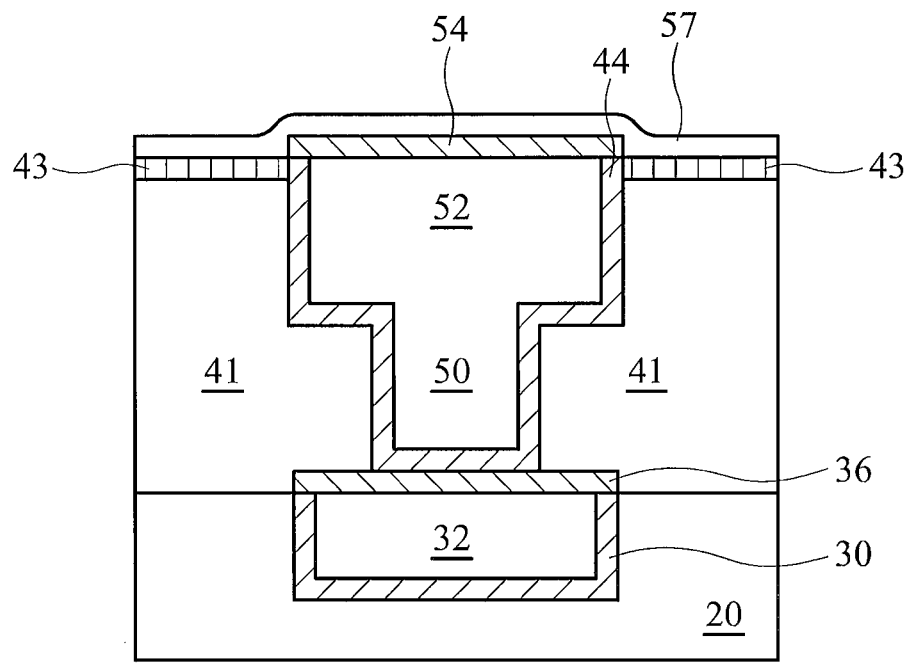

As is known in the art, via IMD layer 40 and trench IMD layer 42 may also be a homogeneous low-k dielectric layer 41, as is shown in FIG. 8B. As is known in the art, a trench opening in the homogeneous low-k dielectric layer 41 can be reliably formed by controlling the etching time, so that the trench opening has a desirable depth. A via opening may be formed using a similar method as is illustrated in FIG. 7. The via opening and trench opening are then filled. FIG. 8B further illustrates the formation of a CMP stop layer 43, which is preferably formed after the formation of trench IMD 42 and before the formation of trench 48 (refer to FIG. 7). As is known in the art, CMP stop layer 43 may also be formed over the trench IMD 42 shown in FIG. 8A.

Figure 9:
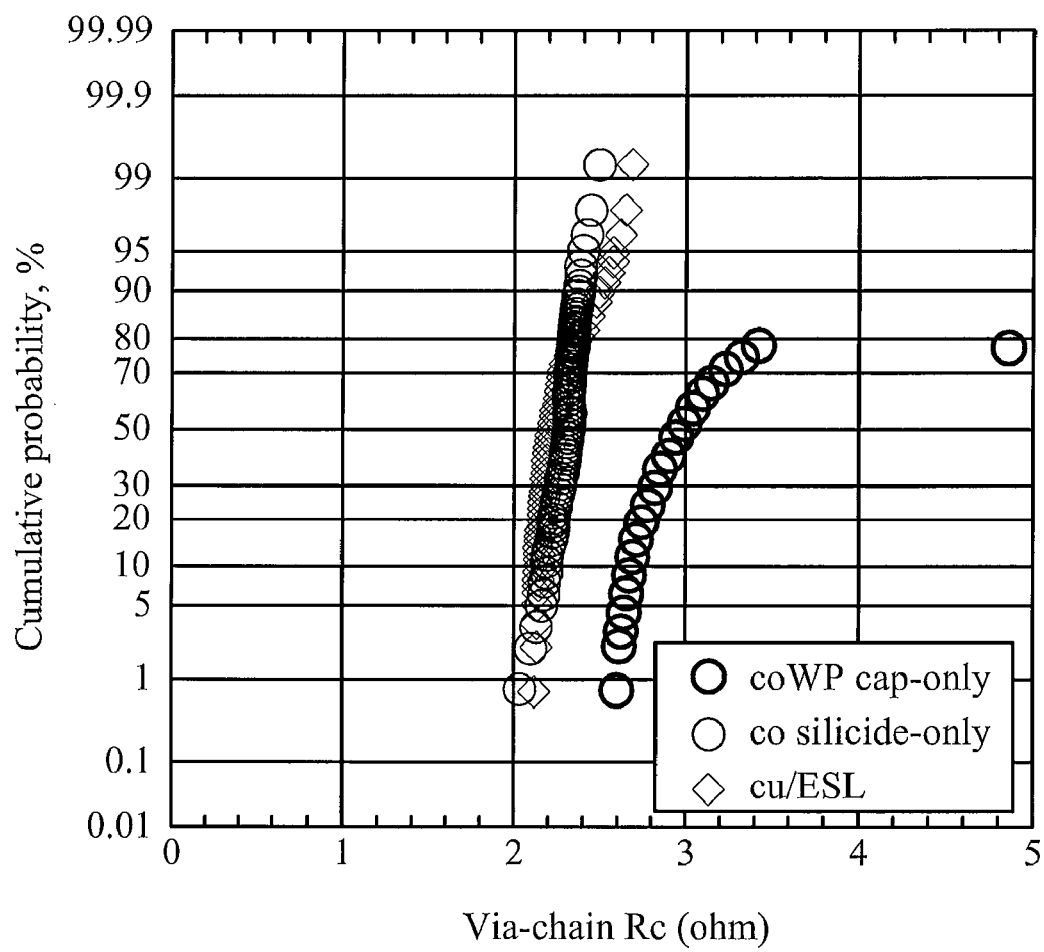
FIG. 9 illustrates the cumulative probability of via chains as a function of via resistances.

The silicidation/germanidation of the cap layer improves the anti-oxidation and anti-chemical contamination properties of the cap layer. The formation of voids in the cap layer is also reduced. As a result, the reliability of the interconnect structure is improved. A test performed on via chains formed of 3.8 million vias has revealed that via chains with silicide caps have significantly improved yield over via chains having CoWP caps. FIG. 9 illustrates the cumulative probability of via chains as a function of via resistances. Hollow circles represent the data obtained from via chains having $CoSi_x$ cap layers. Solid circles represent the data obtained from via chains with CoWP cap layers. Diamonds represent the data obtained from via chains with ESLs (and no cap layers). It is found that via chains with CoWP cap layers have a yield of only about 79 percent. Via chains with silicide cap layers, on the other hand, have a yield comparable to the conventional via structures having ESLs, the yield being 100 percent. The preferred embodiments of the present invention are advantageous over conventional via chains having ESLs because ESLs typically have higher k values than low-k dielectrics, thus interconnect structures formed using the preferred embodiments have lower parasitic capacitance (about 5.5 percent lower) than conventional via chains having ESLs.

Figure 10:
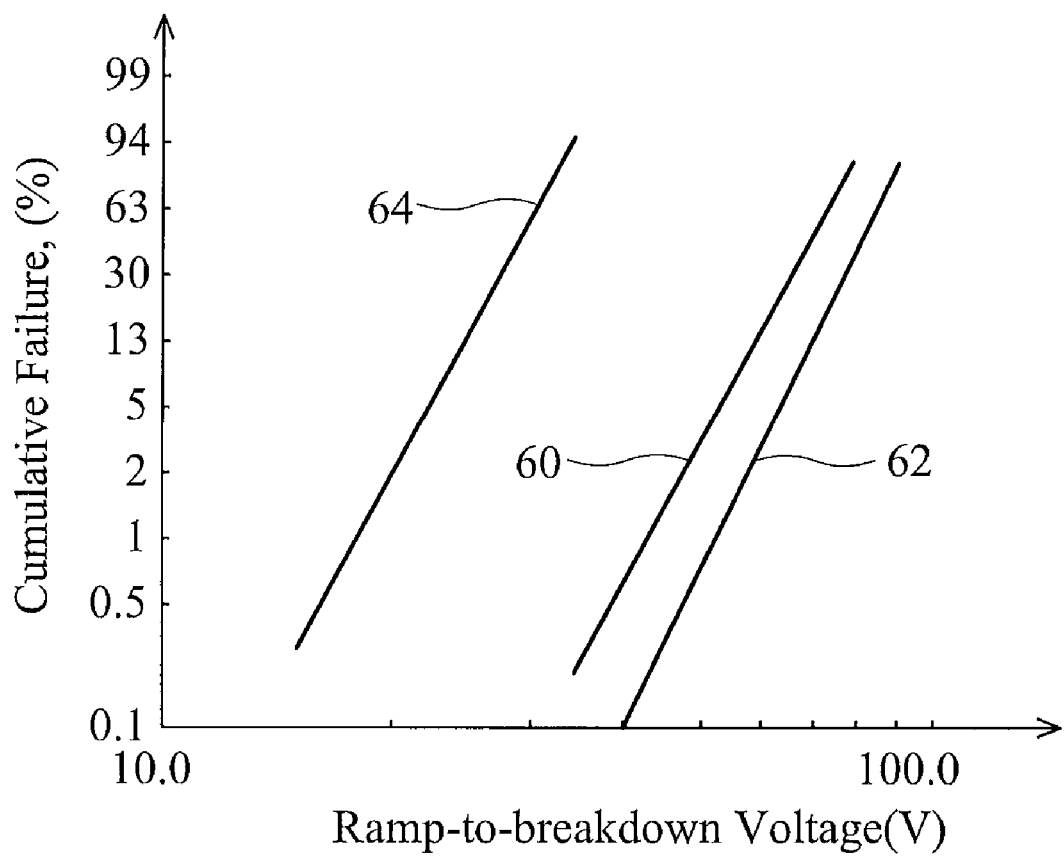
FIG. 10 illustrates time dependent dielectric breakdown (TDDB) data comparing via structures formed using the preferred embodiments and conventional methods.

The interconnect structure formed using the preferred embodiment of the present invention has significantly improved reliability also. FIG. 10 illustrates examples of Weibull (statistical) distributions of the cumulative fraction (F) of interconnect structure breakdown (failure) as a function of ramp-to-breakdown (stress) voltages. The time dependent dielectric breakdown (TDDB) data are obtained from via structures having silicide caps (line 60), CoWP caps (line 62), and ESLs (no cap) (line 64). Significantly greater TDDB voltages have been found on interconnect structures with silicide caps (line 60) and CoWP caps (line 62) over interconnect structures with ESLs. The experimental results have shown that the equivalent TDDB lifetime of the embodiment having silicide caps, which is converted from ramp-to-breakdown (stress) voltages, is about $10^5$ times higher than interconnect structures having ESLs (with no cap layer). Further experimental data has also shown that when under electrical stress for 200 hours, the interconnect structures having silicide caps show no failure, while about 10 percent failure is observed for interconnect structures with a CoWP cap, and about 30 percent failure is observed for interconnect structures with conventional ESLs. Therefore, the overall performance (including via resistance and failure rate) of interconnect structures with silicide caps are better than interconnect structures with metal caps or ESLs.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an interconnect structure, the method comprising:
   providing a low-k dielectric layer;
   forming an opening in the low-k dielectric layer;
   forming a conductor extending from a top surface of the low-k dielectric layer into the low-k dielectric layer;
   forming a metal cap layer extending completely over the conductor; and
   converting at least a top portion of the metal cap layer to a silicide/germanide layer, the conductor remaining unsilicided/ungermanided.

2. The method of claim 1, wherein the metal cap layer is fully silicided.

3. The method of claim 1, wherein the metal cap layer is partially silicided.

4. The method of claim 1, wherein the converting comprises soaking the metal cap layer in silicon-based gases, germanium-based gases, or a combination thereof.

5. A method for forming an interconnect structure, the method comprising:
   providing a low-k dielectric layer;
   forming an opening in the low-k dielectric layer;
   forming a conductor extending from a top surface of the low-k dielectric layer into the low-k dielectric layer;
   forming a metal cap layer over the conductor; and
   converting at least a top portion of the metal cap layer to a silicide/germanide layer, wherein the converting comprises forming a silicon/germanium containing material on the metal cap layer and performing an ultraviolet or ion beam irradiation.

6. The method of claim 1, further comprising performing a pretreatment on the metal cap layer to remove oxygen from the metal cap layer before the converting.

7. The method of claim 6, wherein the pretreatment comprises a hydrogen-based gas bath.

8. The method of claim 6, wherein the pretreatment comprises a nitrogen-based gas bath.

9. The method of claim 1, further comprising oxidizing a top surface of the conductor before the forming the metal cap layer.

10. A method for forming an interconnect structure, the method comprising:
   providing a low-k dielectric layer;
   forming an opening in the low-k dielectric layer;
   forming a copper feature extending from a top surface of the low-k dielectric layer into the low-k dielectric layer;
   forming a conductive cap layer on the copper feature, the conductive cap layer completely covering a top surface of the copper feature; and
   performing a silicidation/germanidation to at least a top portion of the conductive cap layer to form a silicide/germanide layer, the copper feature remaining unreacted from the performing a silicidation/germanidation.

11. The method of claim 10, wherein the step of performing the silicidation/germanidation comprises:
   depositing a silicon/germanium containing material on the conductive cap layer; and
   siliciding/germaniding the conductive cap layer using thermal siliciding/germaniding or plasma siliciding/germaniding.

12. The method of claim 11, wherein the step of depositing the silicon/germanium containing material is performed using a gas selected from the group consisting essentially of $SiH_4$, $Si_2H_6$, SiH, $GeH_4$, $Ge_2H_6$, GeH, and combinations thereof, and wherein the conductive cap layer is silicided/germanided simultaneously with the step of depositing the silicon/germanium containing material.

13. The method of claim 10, wherein the conductive cap layer comprises a material selected from the group consisting essentially of copper, cobalt, nickel, tungsten, molybdenum, tantalum, boron, iron, phosphorus, and combinations thereof.

14. The method of claim 10, wherein the silicide/germanide layer has a thickness of between about 10 Å and about 200 Å.

15. The method of claim 10, further comprising performing a pretreatment before the step of performing the silicidation/germanidation, the pretreatment comprising exposing the conductive cap layer to a nitrogen-containing environment or a hydrogen-containing environment.

16. The method of claim 10, further comprising removing residual silicon/germanium after the silicidation/germanidation.

17. The method of claim 16, wherein the removing the residual silicon/germanium is performed at least in part by thermal removal or plasma removal.

18. A method for forming an interconnect structure, the method comprising:
   providing a low-k dielectric layer comprising silicon;
   forming an opening in the low-k dielectric layer;
   forming a copper feature extending from a top surface of the low-k dielectric layer into the low-k dielectric layer;
   forming a conductive cap layer on the copper feature;
   performing a silicidation to at least a top portion of the conductive cap layer to form a silicide layer; and
   performing a plasma treatment to the silicide layer and the low-k dielectric layer to form an etch stop layer.

19. The method of claim 18, wherein the plasma treatment is performed with a process gas selected from the group consisting essentially of $NH_3$, $CO_2$, $Si(CH_3)_4$, $Si(CH_3)_3H$, $CH_x$, and combinations thereof.

20. The method of claim 18, further comprising performing a pretreatment before the step of performing the silicidation, the pretreatment comprising exposing the conductive cap layer to a nitrogen-containing environment or a hydrogen-containing environment.

* * * * *